United States Patent
Yoo et al.

(10) Patent No.: US 8,106,306 B2
(45) Date of Patent: Jan. 31, 2012

(54) CERAMIC MULTI-LAYER CIRCUIT SUBSTRATE AND MANUFACTURING METHOD THEREOF

(75) Inventors: Won Hee Yoo, Gyunggi-do (KR); Byeung Gyu Chang, Gyunggi-do (KR); Taek Jung Lee, Gyunggi-do (KR); Yong Suk Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 393 days.

(21) Appl. No.: 12/405,729

(22) Filed: Mar. 17, 2009

(65) Prior Publication Data

US 2010/0059266 A1   Mar. 11, 2010

(30) Foreign Application Priority Data

Sep. 5, 2008 (KR) .................. 10-2008-0087827

(51) Int. Cl.
*H05K 1/00* (2006.01)
(52) U.S. Cl. ...................................... 174/258
(58) Field of Classification Search .......... 174/255, 174/260–266; 361/792–795
See application file for complete search history.

(56) References Cited

U.S. PATENT DOCUMENTS

| 7,203,055 B2 * | 4/2007 | Shin et al. ................ 361/306.3 |
| 2003/0100146 A1 | 5/2003 | Nakano et al. |
| 2008/0142147 A1 | 6/2008 | Kawamura et al. |

FOREIGN PATENT DOCUMENTS

| JP | 50-5374 A | 1/1975 |
| JP | 62-244197 A | 10/1987 |
| JP | 63-220598 A | 9/1988 |
| JP | 02-210894 A | 8/1990 |
| JP | 05-267854 A | 10/1993 |
| JP | 2002-271038 | 9/2002 |
| JP | 2003-158375 A | 5/2003 |
| JP | 2006-253435 | 9/2006 |
| JP | 3912153 B2 | 2/2007 |
| JP | 2007-208082 | 8/2007 |
| JP | 2008-034828 | 2/2008 |
| KR | 10-2004-0030803 A | 4/2004 |
| KR | 10-2008-0037041 | 4/2008 |

OTHER PUBLICATIONS

Korean Office Action, with English translation, issued in Korean Patent Application No. 10-2008-0087827, mailed Jun. 22, 2010.
Japanese Office Action issued in Japanese Patent Application No. JP 2009-079752 dated May 24, 2011.

* cited by examiner

*Primary Examiner* — Javaid Nasri
(74) *Attorney, Agent, or Firm* — McDermott Will & Emery LLP

(57) ABSTRACT

Provided is a method of manufacturing a ceramic multi-layer circuit substrate. A plurality of ceramic blocks, in each of which one or more ceramic green sheets having via-electrodes are layered one atop the other, are formed and are then fired. The fired ceramic blocks are aligned with each other. One or more bonding green sheets each having bonding electrodes in positions corresponding to the via-electrodes of the ceramic blocks are prepared. Each of the bonding green sheets is interposed between a pair of the ceramic blocks opposing each other. The ceramic blocks and the bonding green sheets are bonded and are then fired.

6 Claims, 9 Drawing Sheets

CERAMIC MULTI-LAYER CIRCUIT SUBSTRATE AND MANUFACTURING METHOD THEREOF

CROSS-REFERENCE TO RELATED APPLICATIONS

This application claims the priority of Korean Patent Application No. 2008-87827 filed on Sep. 5, 2008, in the Korean Intellectual Property Office, the disclosure of which is incorporated herein by reference.

BACKGROUND OF THE INVENTION

1. Field of the Invention

The present invention relates to a ceramic multi-layer circuit substrate and, more particularly, to a ceramic multi-layer circuit substrate used in a probe card and a manufacturing method thereof.

2. Description of the Related Art

A typical semiconductor test apparatus for testing electric characteristics of chips manufactured on a wafer includes a variety of constitutional parts such as a tester, a performance board, a probe card and so on. In the semiconductor test apparatus, the probe card functions to transfer a signal from the tester via the performance board to pads of the chips on the wafer and to transfer a signal from the chip pads via the performance board to the tester.

A conventional probe card is implemented with a high-temperature co-fired ceramic multi-layer circuit substrate. Specifically, a ceramic multi-layer circuit substrate is manufactured by stacking a plurality of green sheets each having via-electrodes and internal electrodes one atop the other, followed by high-temperature firing. Then, a probe card is manufactured by bonding probe pins on the ceramic multi-layer circuit substrate. In this case, however, the via-electrodes or the internal electrodes are displaced due to constriction of the ceramic green sheets during the firing.

FIG. 1 is a schematic view illustrating a surface of a conventional ceramic multi-layer circuit substrate 10 on which bonding pads are formed. Referring to FIG. 1, electrode patterns 11 are exposed through the surface layer of the ceramic multi-layer circuit substrate 10, and bonding pads 20 are formed on the electrode patterns 11, respectively. In this case, probe cards can be formed by bonding probe pins (not shown) to the bonding pads 20, respectively.

As shown in FIG. 1, the ceramic multi-layer circuit board 10 is formed of a plurality of ceramic green sheets, which are constricted in the firing thereby changing the positions of the electrode patterns 11. Then, the positions of the electrode patterns 11 do not accurately match those of the bonding pads 20. In severe cases, the electrode patterns 11 are not electrically connected with the probe pins to thereby decrease the yield of probe card products. Thus, the bonding pads 20 can be designed with a diameter 0.4 mm or more in consideration of the displacement of the electrode patterns 11 having a diameter from 0.2 to 1.2 mm, thereby causing the yield of probe cards to be about 10%. In this case, however, it is difficult to achieve high integration by decreasing the size of the bonding pads 20.

As an attempt to solve the foregoing problems, a low-temperature firing method is used to manufacture ceramic probe cards without constriction. However, even in this method, when a plurality of ceramic green sheets to be made into the ceramic probe cards has a thickness 1.5 mm or more, they would constrict in the planar direction, thereby displacing via-electrodes or internal electrodes.

SUMMARY OF THE INVENTION

An aspect of the present invention provides a ceramic multi-layer circuit substrate and a manufacturing method thereof, in which a plurality of previously-fired ceramic blocks each having electrode patterns are bonded with each other using bonding green sheets in order to prevent the electrode patterns of the ceramic blocks from being displaced during firing as well as improving the bonding force between the ceramic blocks.

According to an aspect of the present invention, the method of manufacturing a ceramic multi-layer circuit substrate may include: forming a plurality of ceramic blocks, in each of which one or more ceramic green sheets having via-electrodes are layered one atop the other; firing the ceramic blocks; aligning the fired ceramic blocks with each other; preparing one or more bonding green sheets each having bonding electrodes in positions corresponding to the via-electrodes of the ceramic blocks; interposing each of the bonding green sheets between a pair of the ceramic blocks opposing each other; and bonding the ceramic blocks and the bonding green sheets with each other, followed by firing a resultant structure.

In an exemplary embodiment of the present invention, the step of firing the ceramic blocks may include: forming holding layers on both sides of each of the ceramic blocks, the holding layers containing inorganic powder that is not fired at a firing temperature of the ceramic blocks; separately firing the ceramic blocks each with the holding layers on both sides thereof; and removing the holding layers from the fired ceramic blocks.

In another exemplary embodiment of the present invention, each of the ceramic blocks may preferably have a thickness 1.5 mm or less.

In a further exemplary embodiment of the present invention, the step of preparing one or more bonding green sheets may include: producing a ceramic green sheet from a ceramic composition; forming one or more via-holes in the ceramic green sheet by punching the ceramic green sheet in positions corresponding to those of the via-electrodes of the ceramic blocks; and forming the bonding electrodes by filling the via-holes with a metal material. Here, the metal material may be a silver paste.

In another exemplary embodiment of the present invention, each of the green sheets may have a thickness from 40 μm to 100 μm, and each of the bonding electrodes may have a thickness from 45 μm to 130 μm.

According to an aspect of the present invention, the ceramic multi-layer circuit substrate may include a plurality of ceramic blocks, in each of which one or more ceramic green sheets having via-electrodes are layered one atop the other; and one or more bonding green sheets, each of which is interposed between a pair of the ceramic blocks opposing each other and has bonding electrodes in positions corresponding to the via-electrodes of the ceramic blocks.

According to exemplary embodiments of the present invention, a plurality of ceramic blocks each having a thickness 1.5 mm or less are bonded with each other using bonding green sheets having bonding electrodes in order to prevent electrode patterns from being displaced during firing. Accordingly, in the case of manufacturing a probe card, bonding pads can be accurately matched onto the electrode patterns to thereby further improve electrical connection of probe pins. As a result, the yield of ceramic probe cards can be improved.

Furthermore, the bonding force between a plurality of previously-fired ceramic blocks can be improved by bonding the ceramic blocks using bonding green sheets made of a material, which has the same properties as the ceramic blocks.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

The present invention will now be described more fully hereinafter with reference to the accompanying drawings, in which exemplary embodiments thereof are shown.

Figure 1:
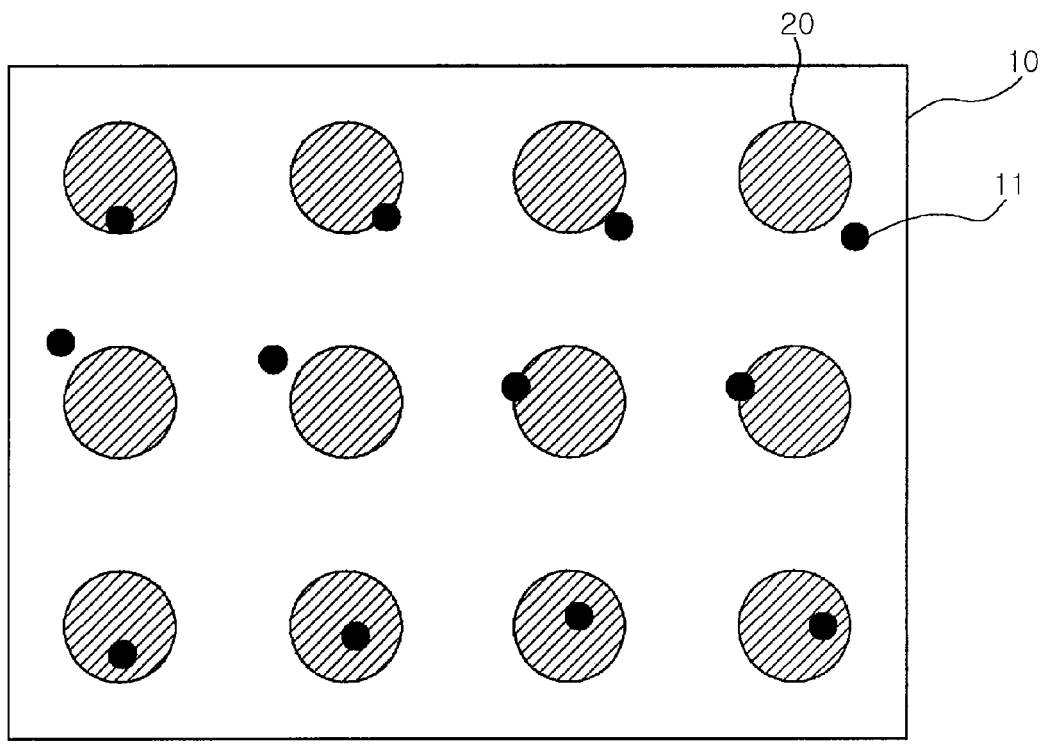
FIG. 1 is a schematic view illustrating a surface of a conventional ceramic multi-layer circuit substrate on which bonding pads are formed.
Figure 2A:
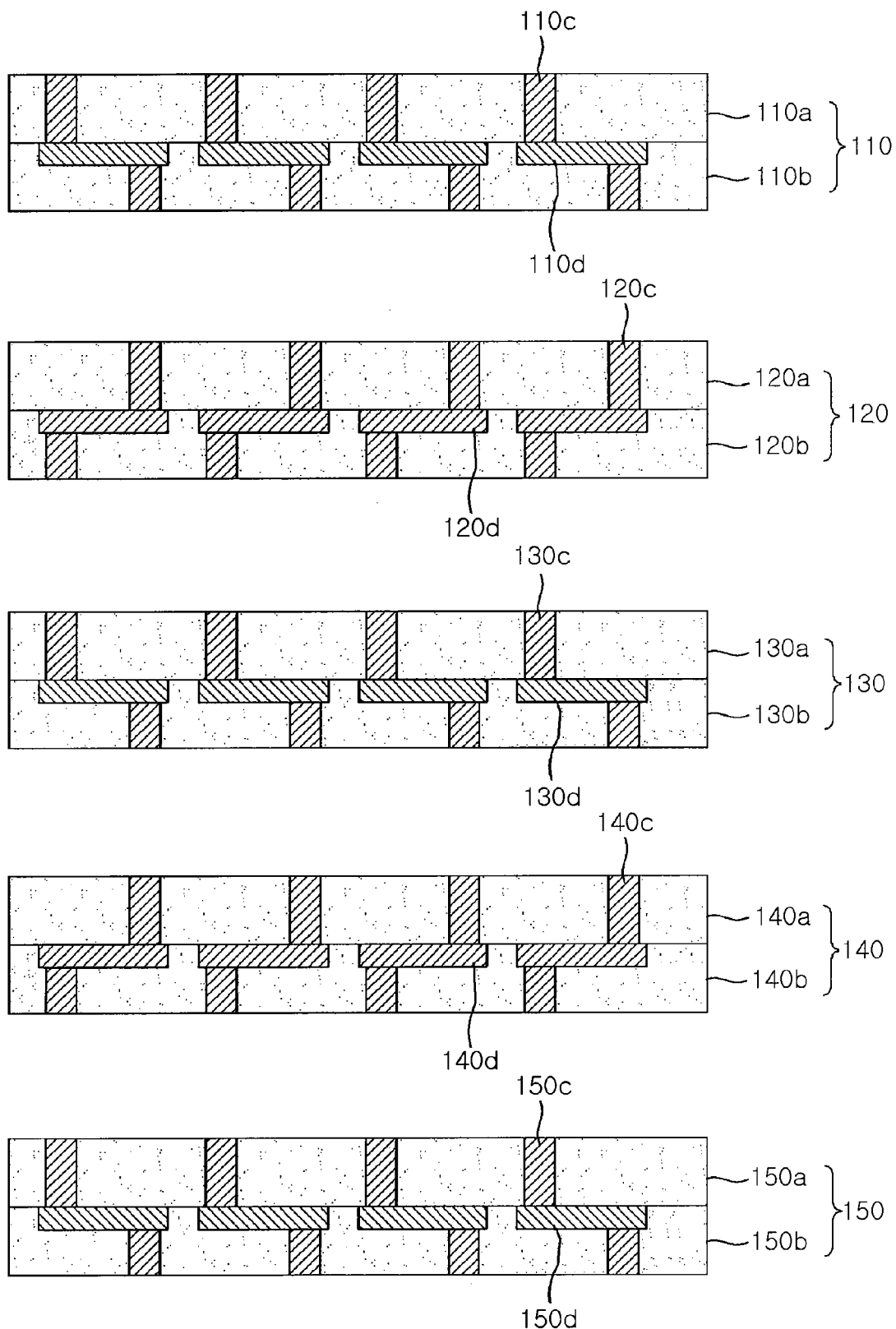
FIGS. 2A through 2D are cross-sectional views illustrating a process of manufacturing a ceramic multi-layer circuit substrate according to an exemplary embodiment of the invention.

FIGS. 2A through 2D are cross-sectional views illustrating a process of manufacturing a ceramic multi-layer circuit substrate according to an exemplary embodiment of the invention. Firstly, as shown in FIG. 2A, first through fifth ceramic blocks 110,120,130,140 and 150, each of which is formed of a plurality of ceramic green sheets, are prepared.

Specifically, the first ceramic block 110 includes first and second ceramic green sheets 110a and 110b, in which via-electrodes 110c and internal electrodes 110d are formed, and the second ceramic block 120 includes third and fourth ceramic green sheets 120a and 120b, in which via-electrodes 120c and internal electrodes 120d are formed. Likewise, the third ceramic block 130 includes fifth and sixth ceramic green sheets 130a and 130b, in which via-electrodes 130c and internal electrodes 130d are formed, and the fourth ceramic block 140 includes seventh and eighth ceramic green sheets 140a and 140b, in which via-electrodes 140c and internal electrodes 140d are formed. In addition, the fifth ceramic block 150 includes ninth and tenth ceramic green sheets 150a and 150b, in which via-electrodes 150c and internal electrodes 150d are formed.

The first through tenth ceramic green sheets 110a, 110b, 120a, 120b, 130a, 130b, 140a, 140b, 150a and 150b can be produced by applying and drying a slurry using a doctor blade method, wherein the slurry is prepared by mixing an organic binder, a dispersing agent and a toluene-ethanol mixture solvent into inorganic powder containing ceramic and glass. In this case, each of the first through fifth ceramic blocks 110, 120,130,140 and 150 made of a plurality of ceramic green sheets is manufactured preferably at a thickness of 1.5 mm or less.

While FIG. 2A illustrates that each of the first through fifth ceramic blocks 110,120,130,140 and 150 includes two ceramic green sheets, three or more ceramic green sheets can be designed for each of the first through fifth ceramic blocks 110,120,130,140 and 150 as long as they do not exceed a thickness 1.5 mm.

Figure 2B:
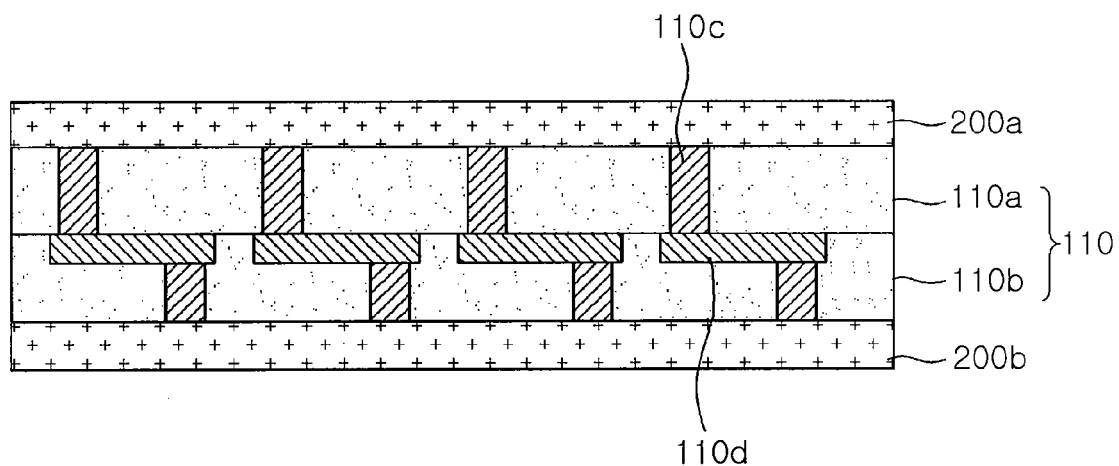

Next, the first through fifth ceramic blocks 110,120,130, 140 and 150 are fired. A process of firing the first ceramic block as shown in FIG. 2B will be described as a representative. As shown in FIG. 2B, holding layers 200a and 200b, which are not fired at a firing temperature of the first ceramic block 110, are layered on the top and underside surfaces of the first ceramic block 110. The firing temperature of the first ceramic block 110 is approximately in the range from 700 to 900° C. The firing temperature of the holding layers 200a and 200b can be higher than the firing temperature of the first ceramic block 110, and be preferably about 1000° C. or more. Materials satisfying this condition may include for example alumina ($Al_2O_3$), zirconia ($ZrO_2$) and the like.

The first ceramic block 110, with the holding layers 200a and 200b formed thereon, is then fired at a temperature approximately in the range from 700 to 900° C. In this case, the first ceramic block 110 is constricted in the thickness direction since their constriction in the planar direction is limited by the holding layers 200a and 200b. Since the first ceramic block 110 is manufactured at a thickness 1.5 mm or less, it is rarely constricted in the planar direction even if constricted during firing. Accordingly, the via-electrodes and the internal electrodes of the ceramic block are not greatly displaced. After the firing is finished, the first ceramic block 110 can have a thickness about 1.0 mm due to the constriction in the width direction during the firing.

Figure 2C:
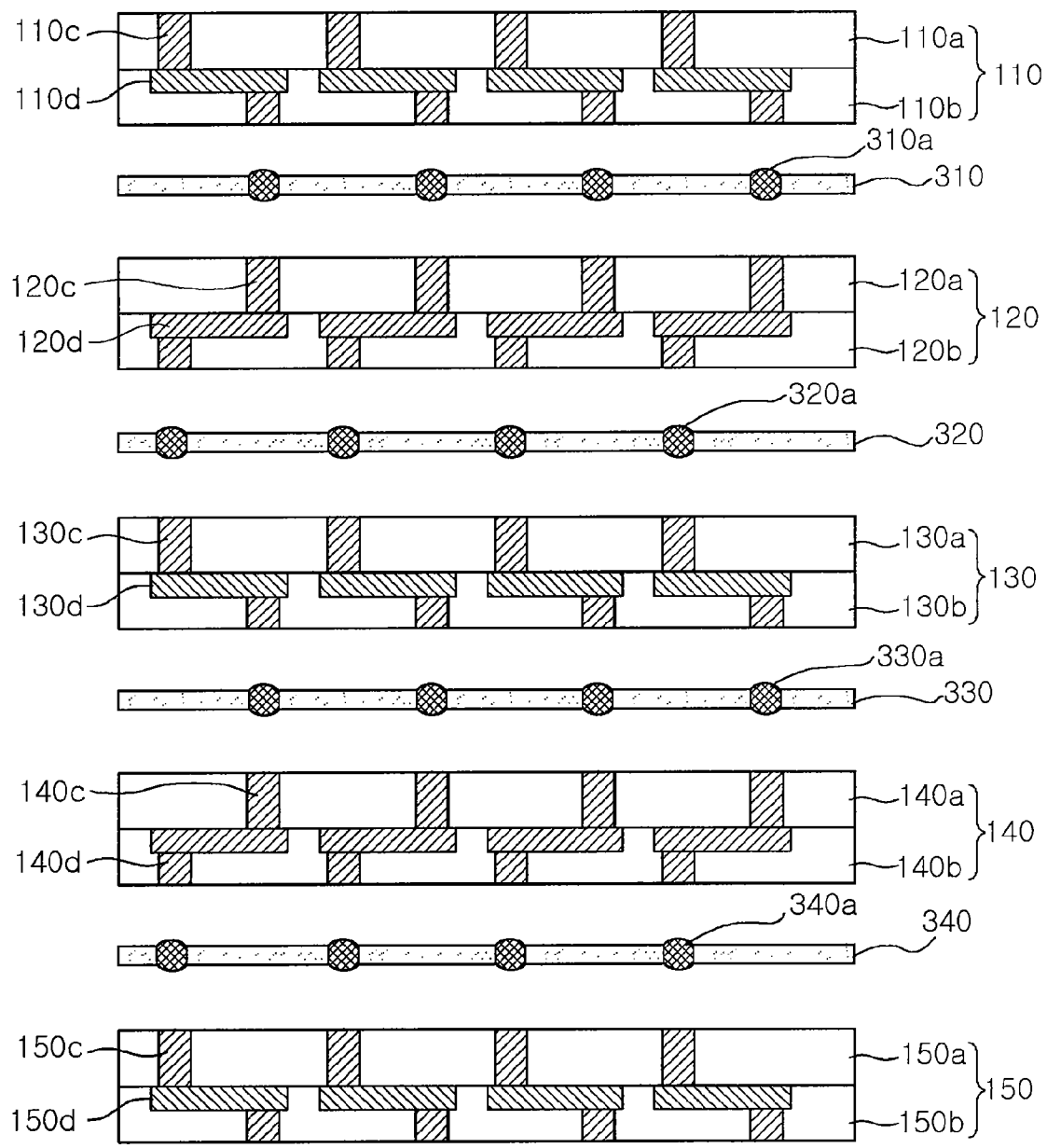

Next, as shown in FIG. 2C, after the first through fifth ceramic blocks 110,120,130,140 and 150 are completely fired, the holding layers 200a and 200b are removed from the first through fifth ceramic blocks 110,120,130,140 and 150. When the holding layers 200a and 200b are removed, polishing can be performed to decrease the surface roughness of the via-electrodes exposed through the surface of the ceramic blocks 110, 120, 130, 140 and 150. The polished via-electrodes can be then plated for example with Ni/Au.

Then, first through fourth bonding green sheets 310, 320, 330 and 340 are interposed between the first through the fifth ceramic blocks 110, 120, 130, 140 and 150. In more detail, the first through the fifth ceramic blocks 110, 120, 130, 140 and 150 with matching electrode patterns such as the via-electrodes and the internal electrodes are aligned in sequence, followed by interposing the first bonding green sheet 310 between the first and second ceramic blocks 110 and 120, and interposing the second bonding green sheet 320 between the second and third ceramic blocks 120 and 130. In addition, the third bonding green sheet 330 is interposed between the third and fourth ceramic blocks 130 and 140, and the fourth bonding green sheet 340 is interposed between the fourth and fifth ceramic blocks 140 and 150. In this case, the first through fourth green sheets 310, 320, 330 and 340 include bonding electrodes 310a, 320a, 330a and 340a, respectively, formed in positions corresponding to the via-electrodes of the opposing ceramic blocks. In this manner, the respective bonding electrodes 310a, 320a, 330a and 340a can bond and electrically connect the opposing ceramic blocks with each other.

Figure 2D:
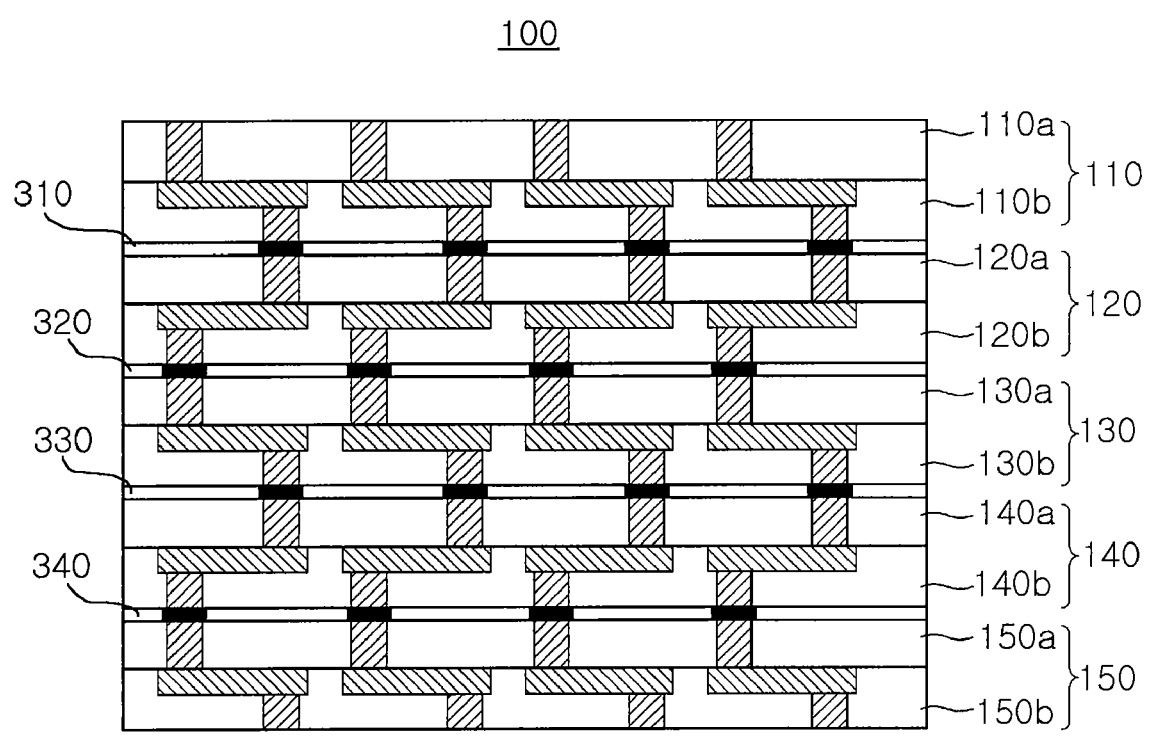

Next, as shown in FIG. 2D, the first through the fifth ceramic blocks 110, 120, 130, 140 and 150 and the first through fourth bonding green sheets 310, 320, 330 and 340, interposed between the first through the fifth ceramic blocks 110, 120, 130, 140 and 150, are bonded with each other and are then fired, thereby producing a ceramic multi-layer circuit substrate 100. The ceramic multi-layer circuit substrate 100 is manufactured by bonding the previously-fired first through fifth ceramic blocks 110, 120, 130, 140 and 150 using the first through fourth bonding green sheets 310, 320, 330 and 340. This structure can prevent or reduce the via-electrodes and the internal electrodes in the first through fifth ceramic blocks 110, 120, 130, 140 and 150 from being displaced. Accordingly, bonding pads (not shown) can be accurately matched with the electrode patterns exposed through the surface layer of the ceramic multi-layer circuit substrate 100 when probe pins are bonded to the ceramic multi-layer circuit substrate 100 using the bonding pads.

Figure 3A:
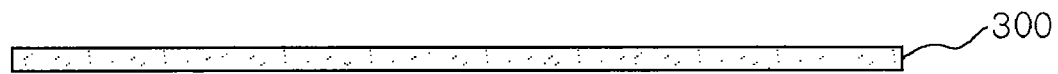
FIGS. 3A through 3C are cross-sectional views illustrating a process of manufacturing a green sheet according to an exemplary embodiment of the invention.
Figure 3B:
Figure 3C:
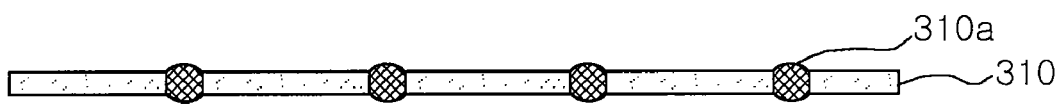

FIGS. 3A through 3C are cross-sectional views illustrating a process of manufacturing green sheets according to an exemplary embodiment of the invention. A process of manufacturing the first bonding green sheet 310 as shown in FIG. 2C will be described as a representative. First, as shown in FIG. 3A, a ceramic green sheet 300 containing inorganic ceramic powder is manufactured. In more detail, the ceramic green sheet 300 can be manufactured by applying and drying slurry, wherein the slurry is prepared by adding a dispersing agent and a mixture solvent into inorganic powder containing ceramic and glass. In this case, it is preferable that the inorganic ceramic powder is the same as the inorganic ceramic powder contained in the ceramic green sheets of the first through fifth ceramic blocks 110, 120, 130, 140 and 150 as shown in FIG. 2C.

Each of the ceramic green sheets 300 can be manufactured at a thickness 40 to 100 μm. If the thickness of the ceramic green sheet 300 is less than 40 μm, the bonding force of the opposing ceramic blocks decreases. If the thickness of the ceramic green sheet 300 is greater than 100 μm, it may constrict in the planar direction while being fired.

Then, predetermined portions of the ceramic green sheet 300 are punched, thereby forming a plurality of via-holes 330 as shown in FIG. 3B. In this case, the via-holes 330 can be formed in predetermined positions matching the via-electrodes 110c and 120c between the first and second ceramic blocks 110 and 120.

Next, as shown in FIG. 3C, an electrode paste is filled into the via-holes 330 of the ceramic green sheet 300, thereby producing the first bonding green sheet 310 having the bonding electrodes 310a, which were shown in FIG. 2C. In this case, the electrode paste may contain silver. In addition, the bonding electrodes 310a can be formed at a thickness approximately in the range from 45 to 130 μm. The thickness of the bonding electrodes 310a is preferably greater than that of the first bonding green sheet 310, so that the bonding electrodes 310a can compensate for a space that may occur due to constriction during the firing, which is performed with the first bonding green sheet 310 interposed between the first and second ceramic blocks 110 and 120.

Although not shown in the figures, the second through fourth bonding green sheets 320, 330 and 340 shown in FIG. 2C can also be manufactured in the same manner as illustrated in FIGS. 3A through 3C.

Figure 4:
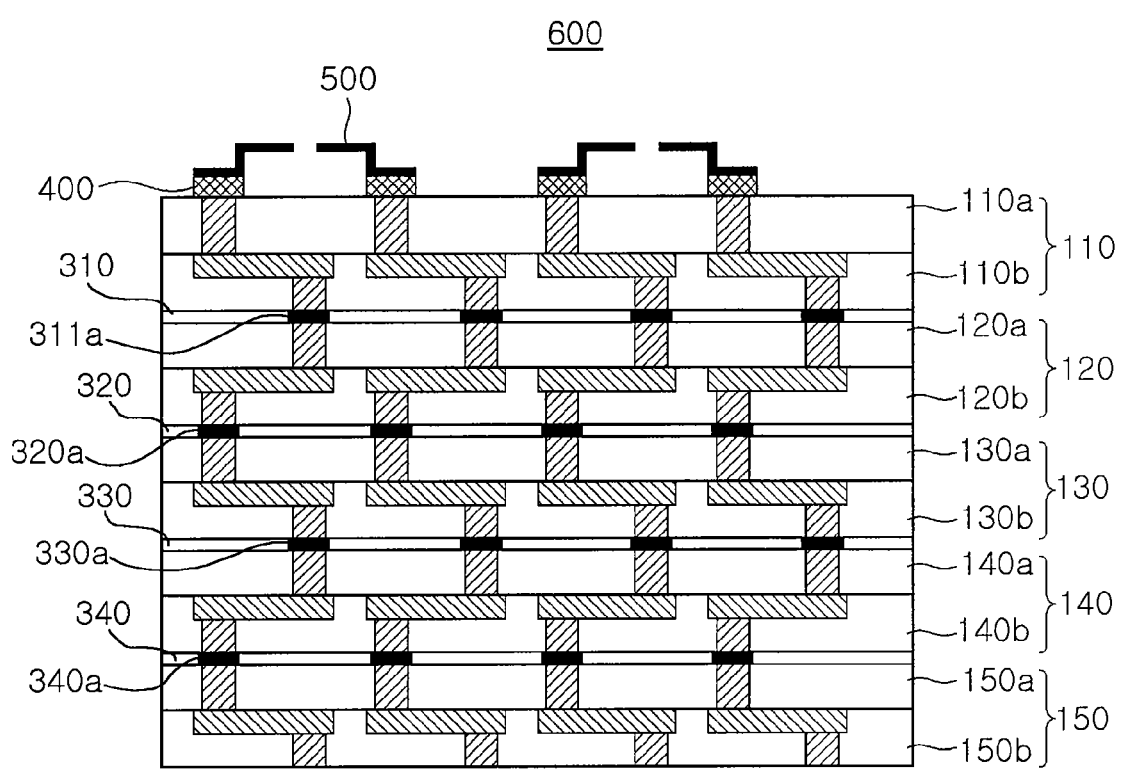
FIG. 4 is a cross-sectional view illustrating a probe card using a ceramic multi-layer circuit substrate according to an exemplary embodiment of the invention.

FIG. 4 is a cross-sectional view illustrating a probe card using a ceramic multi-layer circuit substrate according to an exemplary embodiment of the invention. In greater detail, the ceramic probe card 600 shown in FIG. 4 is manufactured using the ceramic multi-layer circuit substrate 100 shown in FIG. 2D, and includes the ceramic multi-layer circuit substrate 100, bonding pads 400 and probe pins 500.

The ceramic multi-layer circuit substrate includes the first through fifth ceramic blocks 110, 120, 130, 140 and 150 and the first through fourth bonding green sheets 310, 320, 330 and 340, which are interposed between the first through fifth ceramic blocks 110, 120, 130, 140 and 150. In this case, the first through fourth bonding green sheets 310, 320, 330 and 340 can include the bonding electrodes 310a, 320a, 330a and 340a in positions corresponding to the via-electrodes of the first through fifth ceramic blocks 110, 120, 130, 140 and 150. Through the bonding electrodes 310a, 320a, 330a and 340a, the first through fifth ceramic blocks 110, 120, 130, 140 and 150 are electrically connected with each other.

The bonding pads 400 are formed on the via-electrodes exposed through the surface layer of the ceramic multi-layer circuit substrate, and the probe pins 500 are formed on the bonding pads 400, thereby forming the ceramic probe card 600. This as a result improves the positional accuracy of the via-electrodes and the internal electrodes of the ceramic multi-layer circuit substrate, thereby increasing the matching accuracy with the bonding pads 400. Accordingly, the via-electrodes are located in areas where the bonding pads 400 will be formed to thereby increase the yield of the ceramic probe card 600.

Figure 5:
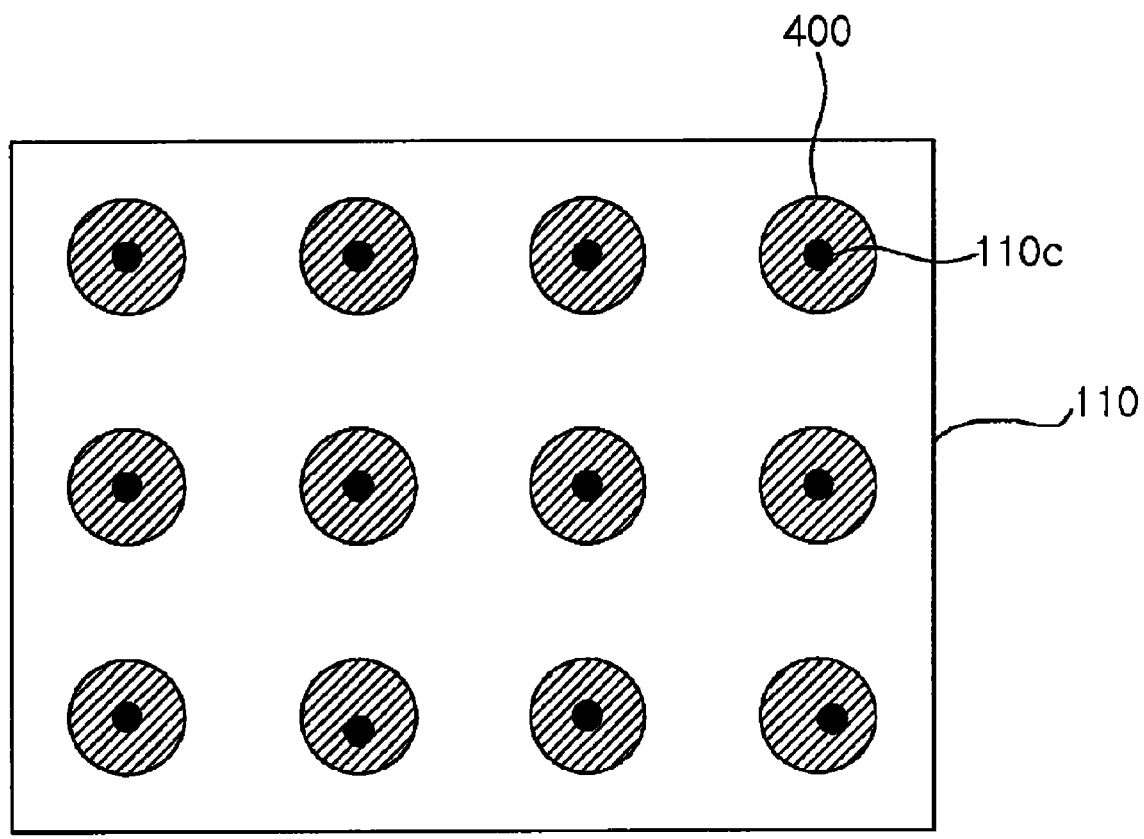
FIGS. 5 and 6 are schematic views illustrating a surface of a ceramic probe card according to an exemplary embodiment of the invention on which bonding pads are formed.
Figure 6:
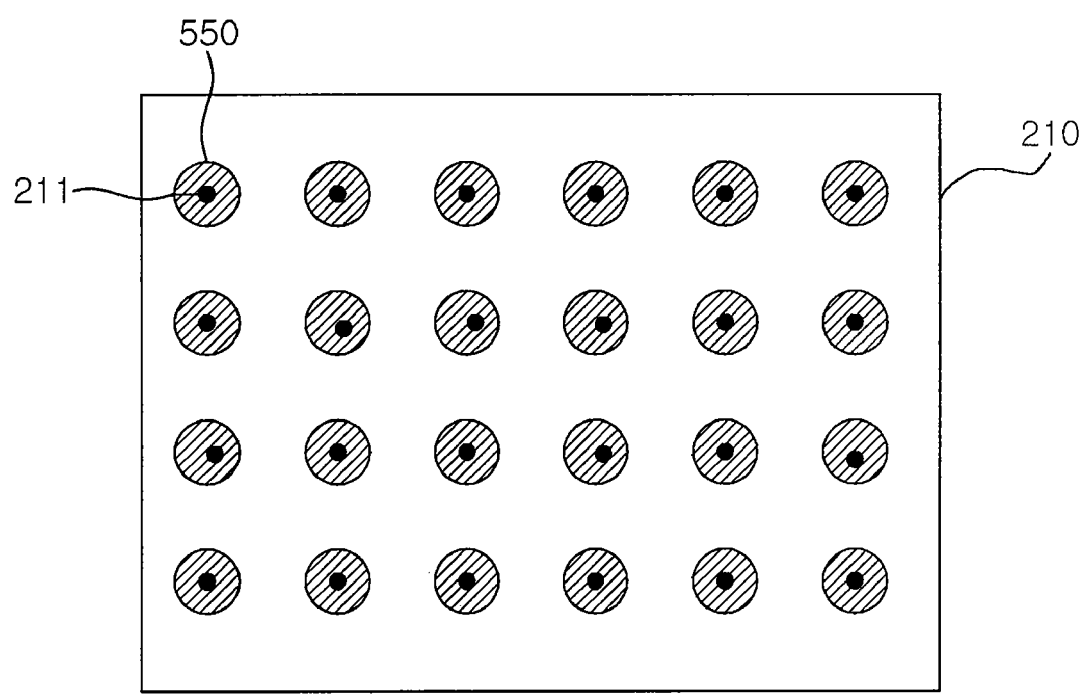

FIGS. 5 and 6 are schematic views illustrating a surface of a ceramic probe card according to an exemplary embodiment of the invention on which bonding pads are formed. FIG. 5 shows a surface of the ceramic probe card 600, as shown in FIG. 4, on which the bonding pads 400 are formed. Referring to FIG. 5, the bonding pads 400 are formed on the surface layer of the ceramic probe card 600, and the via-electrodes 110c are formed under the bonding pads 400. Here, the via-electrodes 110c having a diameter approximately in the range from 0.2 to 1.2 mm are located in the area of the bonding pads 400 having a diameter 0.4 mm. As such, the via-electrodes 110c are not displaced, thereby increasing the matching accuracy between the via-electrodes 110c and the bonding pads 400. Accordingly, the electrical connection of the probe pins 500 is improved to thereby increase the yield of the ceramic probe card 600.

FIG. 6 shows highly-integrated probe pads formed on the ceramic probe card, which is manufactured according to the invention. Referring to FIG. 6, via-electrodes 211 are exposed on the surface of a ceramic probe card 210, and the via-electrodes 211 are formed under the bonding pads 550. When compared with the bonding pads 400 shown in FIG. 5, it can be appreciated that the size of the bonding pads 550 shown in FIG. 6 is reduced. In other words, the bonding pads 550 are highly integrated. This is due to improved positional accuracy of the via-electrodes 211. Accordingly, even if bonding pads 550 smaller than those shown in FIG. 5 are used, the via-electrodes 211 can be easily connected with the bonding pads 550.

While the present invention has been shown and described with reference to certain exemplary embodiments thereof, it will be understood by those skilled in the art that various changes in form and details may be made therein without departing from the spirit and scope of the present invention as defined by the appended claims and their equivalents.

What is claimed is:

1. A method of manufacturing a ceramic multi-layer circuit substrate, comprising steps of:

forming a plurality of ceramic blocks, in each of which one or more ceramic green sheets having via-electrodes and a thickness of 1.5 mm or less are layered one on top of another;

firing the ceramic blocks;

aligning the fired ceramic blocks with each other;

preparing one or more bonding green sheets each having bonding electrodes in positions corresponding to the via-electrodes of the ceramic blocks and having a thickness from about 40 μm to about 100 μm;

disposing each of the bonding green sheets between a pair of the ceramic blocks opposing each other;

bonding the ceramic blocks with the bonding green sheets into a resultant structure; and firing the resultant structure.

2. The method of claim 1, wherein firing the ceramic blocks comprises:

forming holding layers on both sides of each of the ceramic blocks, the holding layers containing inorganic powder that is not fired at a firing temperature of the ceramic blocks;

separately firing the ceramic blocks each with the holding layers on both sides thereof; and removing the holding layers from the fired ceramic blocks.

3. The method of claim 1, wherein the step of preparing one or more bonding green sheets comprises:

producing a ceramic green sheet from a ceramic composition;

forming one or more via-holes in the ceramic green sheet by punching the ceramic green sheet in positions corresponding to the via-electrodes of the ceramic blocks; and forming the bonding electrodes by filling the via-holes with a metal material.

4. The method of claim 3, wherein the metal material comprises silver paste.

5. The method of claim 1, wherein each of the bonding electrodes has a thickness from about 45 μm to about 130 μm.

6. A ceramic multi-layer circuit substrate comprising:

a plurality of ceramic blocks each having a thickness of 1.5 mm or less, in each of which one or more ceramic green sheets having via-electrodes are layered one on top of another; and one or more bonding green sheets, each of which is disposed between a pair of the ceramic blocks opposing each other and has bonding electrodes in positions corresponding to the via-electrodes of the ceramic blocks and has a thickness from about 40 μm to about 100 μm.

* * * * *